United States Patent [19]
Zolper et al.

[11] Patent Number: 5,866,925
[45] Date of Patent: Feb. 2, 1999

[54] GALLIUM NITRIDE JUNCTION FIELD-EFFECT TRANSISTOR

[75] Inventors: John C. Zolper; Randy J. Shul, both of Albuquerque, N. Mex.

[73] Assignee: Sandia Corporation, Albuquerque, N. Mex.

[21] Appl. No.: 781,068

[22] Filed: Jan. 9, 1997

[51] Int. Cl.$^6$ .................................................. H01L 29/80
[52] U.S. Cl. ........................ 257/279; 257/256; 438/186
[58] Field of Search ..................................... 257/279, 256

[56] References Cited

U.S. PATENT DOCUMENTS

| | | | |
|---|---|---|---|
| 4,985,742 | 1/1991 | Pankove | 357/34 |
| 5,192,987 | 3/1993 | Khan et al. | 257/183.1 |
| 5,296,395 | 3/1994 | Khan et al. | 437/40 |
| 5,318,924 | 6/1994 | Lin et al. | 437/192 |
| 5,385,862 | 1/1995 | Moustakas | 437/107 |
| 5,510,632 | 4/1996 | Brown et al. | 257/77 |
| 5,536,953 | 7/1996 | Dreifus et al. | 257/77 |
| 5,559,053 | 9/1996 | Choquette et al. | 437/129 |
| 5,563,422 | 10/1996 | Nakamura et al. | 257/13 |
| 5,585,648 | 12/1996 | Tischler | 257/77 |

OTHER PUBLICATIONS

Zolper et al. "Ion–implanted GaN junction field effect transistor" APL pp. 2273–2275 15 Apr. 1996.

Pearton et al. "Ion implantation doring and isolation GaN" APL pp. 1435–1437 4 Sep. 1995.

Zolper et al. "P–and N–type implanatation doping of GaN with Ca and O" MRS Sp 96 8 Apr. 1996.

Binari, S.C., et al., "D.C. Microwave and High–Temperature Characteristics of GaN FET Structures," *ISCS Proceedings*, pp. 1–4, (1994).

Sherwin, M.E., et al., "An All Implanted Self–Aligned Enhancement Mode n–JFET with Zn Gates for GaAs Digital Applications," *IEEE Electron Device Letters*, vol. 15, No. 7 pp. 242–244 (Jul. 1994).

Pearton, S.J., "Ion Implantation Doping and Isolation of GaN," *Appl. Phys. Lett* vol. 67, No. 10 pp. 1435–1437 (Sep. 1995).

Zolper, J.D., et al., "Enhanced High–Frequency Performance in a GaAs, Self–Aligned, n–JFET Using a Carbon Buried p–Implant," *IEEE Electron Device Letters*, vol. 15, No. 12 (Dec. 1994).

Markoc, H., et al., "Large Band Gap SiC, III–V Nitride and IIVI ZnSe–Based Semiconductor Device Technologies," *J. Appl. Phys.*, vol. 76, No. 3, pp. 1363–1398 (Aug. 1 1994).

Yuan, C., et al., "High Quality P–Type GaN Deposition on c–Sapphire Substrates in a Multiwafer Rotating–Disk Reactor," *J. Electrochem. Soc.*, vol. 142, No. 9, pp. L163–L165 (Sep. 1995).

Zolper, J.C., et al., "An All–Implanted, Self–Aligned, GaAs JFET With a Nonalloyed W/p+–GaAs Ohmic Gate Contact," *IEEE Transactions on Electron Devices*, vol. 41, No.7, pp. 1077–1082 (Jul. 1994).

Zipperian, T.E., et al. "A Survey of Materials and Device Technologies for High–Temperature (T>300°C), Power Semiconductor Electronic," *12th Int'l PCI Conference 1986 Proceedings*, pp. 353–365 (Oct. 1986).

Khan, M.A., et al., "High Electron Mobility Transistor Based on a GaN–Al$_x$Ga$_{1-x}$N Heterojunction," *Appl. Phys. Lett*, vol. 63, No. 9, pp. 1214–1249 (Aug. 30, 1993).

Binari, S.C., et al., "Microwave Performance of GaN MESFETs," *Electronic Letters*, vol. 30, No. 15, pp. 1248–1249 (Jul. 21 1994).

(List continued on next page.)

*Primary Examiner*—Olik Chaudhuri
*Assistant Examiner*—Douglas A. Wille

[57] ABSTRACT

An all-ion implanted gallium-nitride (GaN) junction field-effect transistor (JFET) and method of making the same. Also disclosed are various ion implants, both n- and p-type, together with or without phosphorous co-implantation, in selected III–V semiconductor materials.

39 Claims, 13 Drawing Sheets

OTHER PUBLICATIONS

Khan, M.A., et al., "Metal Semiconductor Field Effect Transistor Based on Single Crystal GaN," *Appl. Phys. Lett.*, vol. 62, No. 15, pp. 1786–1787 (Apr. 12 1993).

Shul, R.J., et al., "Plasma Chemistry Dependent ECR Etching of GaN," *Materials Research Society 1995*, (Apr. 1995).

Zolper, J.C., et al., "Gallium Nitride Junction Field Effect Transistors for high–Temperature Operation," *3rd Int'l High Temperature Electronics Conf.*, (Jun. 1996).

Zolper, J.C., et al., "P–and N–Type Implantation Doping of GaN with Ca and O," *Materials Research Society Spring 1996*, (Apr. 8–12 1996).

Zolper, J.C., et al., "Ion Implantation for High Performance III–V JFETs and HFETs," *Material Research Society* (Apr. 8–11 1996).

Zolper, J.C., et al., "Ion Implantation for III–Nitride Materials," *1996 Workshop on Compound Semiconductor Materials and Devices*, IEEE, (Feb. 19–21 1996).

Zolper, J.C. et al., "Ion–Implanted GaN Junction Field Effect Transistor," *appl. Phys. Lett.*, vol. 68, No. 16, pp. 2273–2275 (Apr. 15 1996).

Zolper, J.C., et al., "III–Nitride Ion Implantation and Device Processing," *Electrochemical Soc*, Abstract (May 5–10 1996).

GALLIUM NITRIDE JUNCTION FIELD-EFFECT TRANSISTOR

GOVERNMENT RIGHTS

This invention was made with Government support under Contract No. DE-AC04-94AL85000 awarded by the U.S. Department of Energy. The Government has certain rights in the invention.

BACKGROUND OF THE INVENTION

1. Field of the Invention (Technical Field)

The present invention relates to gallium nitride (GaN) junction field-effect transistors (JFETs) and to methods of making such transistors.

2. Background Art

Gallium nitride (hereinafter GaN) is an attractive material for use in high temperature, high power electronic devices due to its high bandgap (3.39 eV), high breakdown field (~5×10$^6$ V/cm), high saturation drift velocity (2.7×10$^7$ cm-s$^{-1}$), and chemical inertness. Morkoc, et al., *J. Appl. Phys.* 76(3), p. 1363, Aug. 1, 1994. Metal semiconductor FETs (MESFETs), high electron mobility transistors (HEMTs), heterostructure FETs (HFETs), and metal insulator semiconductor FETs (MISFETs) have all been developed using epitaxial AIN/GaN structures. Khan, et al, *Appl. Phys. Lett.* vol. 62, p. 1786 (1993); Khan, et al., *Appl. Phys. Lett.* vol. 63, p. 1214 (1993); Binari, et al., *Proc.* 1994 *ISCS*, 9/94, *Inst. Phys.*, Bristol, UK, pp. 492–496 (1995); and *PCI Proceedings*, pp. 353–365, October 1986.

The patent literature also describes the use of GaN. U.S. Pat. No. 4,985,742, to Pankove, entitled "High Temperature Semiconductor Devices Having at Least One Gallium Nitride Layer", discloses the application of GaN layers to other semiconductors to act as a contact or window layers. No JFET use or structure is disclosed. U.S. Pat. Nos. 5,192,987 and 5,296,395, to Khan, et al., respectively titled "High Electron Mobility Transistor with GaN/Al$_x$ GA$_{1-x}$N Heterojunctions" and "Method of Making a High Electron Mobility Transistor", both disclose the use of GaN which is epitaxially doped, lacks a p/n junction gate, and lacks p-type doping.

The use of ion implantation doping in semiconductor devices employing GaAs JFET's was described by Zolper, et al., "An All-Implanted, Self-Aligned, GaAs JFET with a Nonalloyed W/p$^+$-GaAs Ohmic Gate Contact", *IEEE Transaction on Electron Devices*, vol. 41, pp. 1078–1082, July, 1994; Sherwin, et al., "An All Implanted Self-Aligned Enhancement Mode n-JFET with Zn Gates for GaAs Digital Application," *IEEE Electron Device Letters*, vol. 15, pp. 242–244, July, 1994; and Zolper, et al., "Enhanced High-Frequency Performance in a GaAs Self-Aligned, n-JFET Using a Carbon Buried p-Implant," *IEEE Electron Device Letters*, vol. 15, pp. 493–495, December 1994.

GaN thin films have been developed in the prior art by epitaxial growth on c-sapphire. Yuan, et al., "High Quality P-Type GaN Deposition on c-Sapphire Substrates in a Multiwafer Rotating-Disk Reactor", *J. Electrochem Soc.*, vol. 142, pp. L163–L65, September 1995. Such GaN films have also been ion implanted, that is, n- and p-type regions have been produced in GaN using Si$^+$ and Mg$^+$/P$^+$ implantation and subsequent annealing. Pearton, et al., entitled "Ion Implantation Doping and Isolation of GaN," *Appl. Phys. Lett.* vol. 67, pp. 1435–1437, September 1995. Electron cyclotron resonance (ECR) etching of GaN films in various gaseous plasmas has also been accomplished in the prior art. Shul, et al., "Plasma Chemistry Dependent ECR Etching of GaN," *Mater. Res. Soc., Symposium AM*, November 1995.

The prior art fails to disclose, however, production of a GaN JFET fabricated with ion implantation doping, as noted by recent publications of Applicants. Zolper, et al., "Ion-Implanted GaN Junction Field Effect Transistor," *Appl. Phys. Lett., vol.* 68, pp. 2273–2275, 15 Apr., 1996; Zolper, et al., "III-Nitride Ion Implantation and Device Processing", Electrochemical Society Meeting, May 1996; Zolper, et aL, "Gallium Nitride Junction Field Effect Transistor for High Temperature Operation", 3rd International High Temperature Electronic Conf., June 1996; and Zolper, et al., "P- and N-Type Implantation Doping of GaN with Ca and O", Materials Research Society April 1996.

SUMMARY OF THE INVENTION
(DISCLOSURE OF THE INVENTION)

The present invention is of a gallium-nitride (GaN) junction field-effect transistor (JFET) and method of making a GaN JFET comprising: providing a GaN substrate; ion-implanting an n-channel and a p-gate upon the GaN substrate; sputter depositing gate contact metal upon the p-gate; patterning the gate contact; ion implanting source and drain regions; annealing and thereby activating the implanted ions; etching the source and drain regions; and depositing ohmic metal upon the source and drain regions. In the preferred embodiment, the GaN substrate comprises an epitaxially-grown GaN layer upon a c-plane sapphire substrate, preferably by a metalorganic chemical vapor deposition (MOCVD) growth process. Silicon (Si) is preferably used for the n-channel, implanted at an energy of between approximately 10 keV to 400 keV at a dose ranging from approximately 5×10$^{12}$ to 5×10$^{15}$ cm$^{-2}$. Calcium (Ca) is preferably used for the p-gate, ion implanted at an energy of between approximately 10 keV to 400 keV and at a dose between approximately 5×10$^{13}$ and 1×10$^{16}$ cm$^{-2}$. The source and drain regions are preferably Si implanted at energies of between approximately 40 keV to 400 keV and at doses of between approximately 5×10$^{13}$ and 1×10$^{16}$ cm$^{-2}$. The p-gate may employ calcium and phosphorous (Ca+P), magnesium (Mg), magnesium and phosphorous (Mg+P), carbon (C), zinc (Zn), and/or cadmium (Cd). The n-channel may employ oxygen (O). Annealing and hereby activating the implanted ions is preferably performed at approximately 1000 to 1300° C. for approximately 5 to 30 seconds. Etching the source and drain regions is preferably performed in a plasma containing BCl$_3$, H$_2$, and Ar, and/or in an electron cyclotron resonance (ECR) plasma. The gate contact preferably comprises sputtered tungsten and/or a refractory metal alloy selected from the group consisting of WSi$_2$, WN, and TiWN. The ohmic metal upon the source and drain regions preferably comprises a thickness of approximately 20 nanometers of titanium (Ti) followed by approximately 200 nanometers of aluminum (Al). The ohmic metal may include additional layers selected from the group consisting of Ti, Al, nickel (Ni), and gold (Au).

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention.

In the drawings.

DETAILED DESCRIPTION OF THE INVENTION

Figure 1:
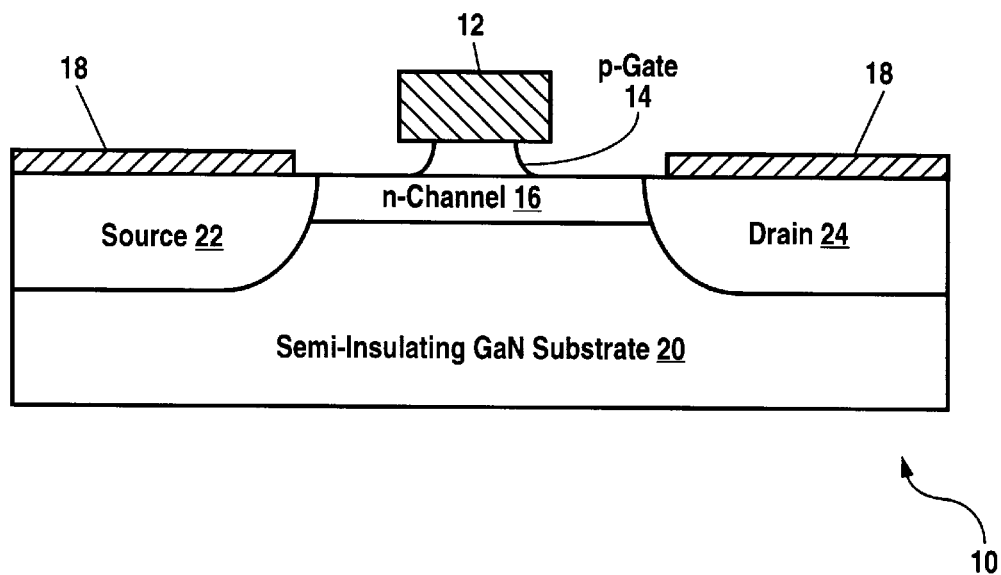
FIG. 1 is a schematic cross-section of a GaN JFET.

With reference to the drawings, FIG. 1 schematically represents the preferred embodiment of the GaN JFET 10 of the invention. The GaN JFET 10 generally comprises a tungsten gate contact 12, a p-gate 14, an n-channel 16, ohmic metal contacts 18, and a GaN substrate 20. The GaN substrate 20 is generally about 1.5–2.0 $\mu$m thick, and is grown on a c-plane sapphire substrate by metalorganic chemical vapor deposition in a multiwafer disk reactor at about 1040° C. with a ~20 nm GaN buffer layer first grown at about 530° C. The GaN layers are semi-insulating (SI) with background n-type carrier concentration about $1\times10^{16}$ cm$^{-3}$ or less. The GaN layers generally have featureless surfaces and are transparent with a strong bandedge luminescence near 3.484 eV at 14K.

Figure 2A:
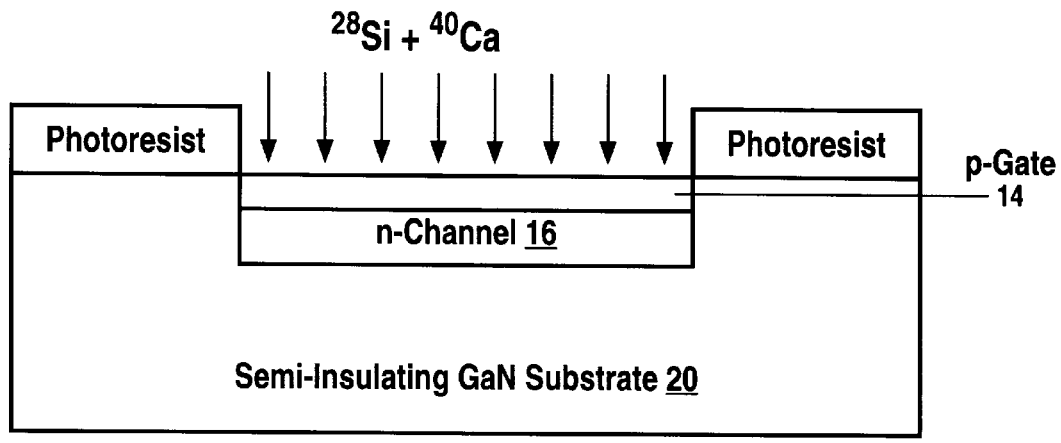
FIGS. 2a–2f show process steps for making a GaN JFET.
Figure 2B:
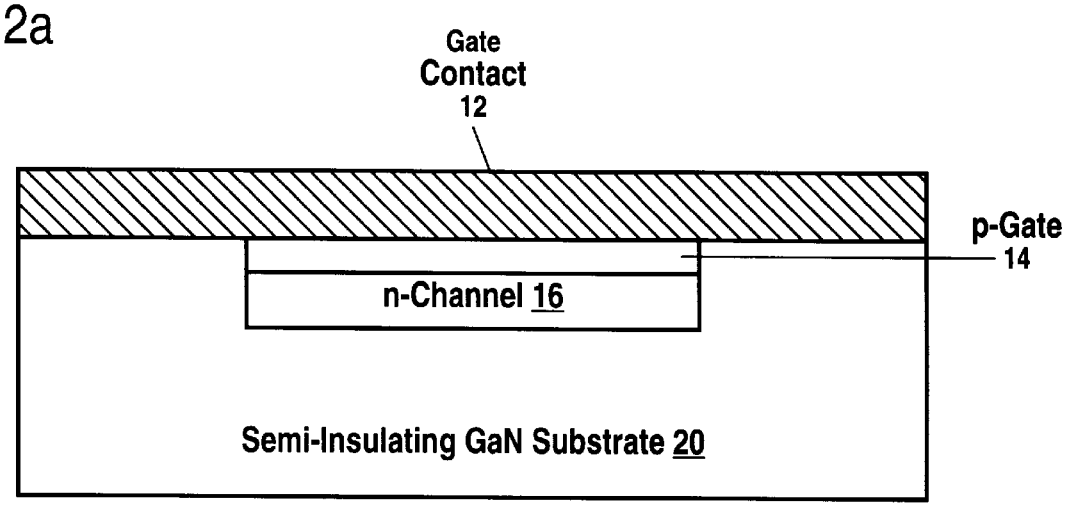
Figure 2C:
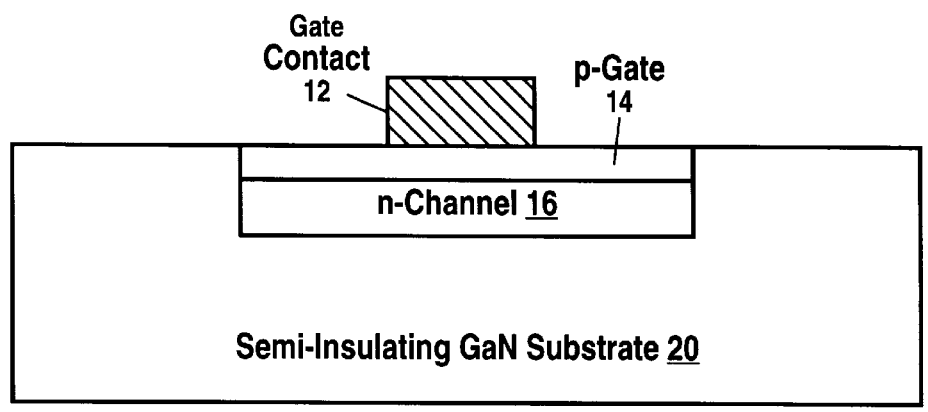
Figure 2D:
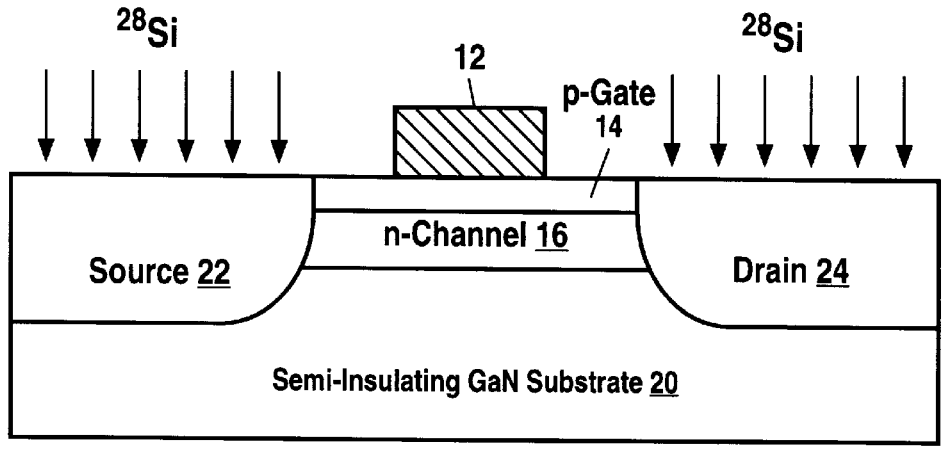
Figure 2E:
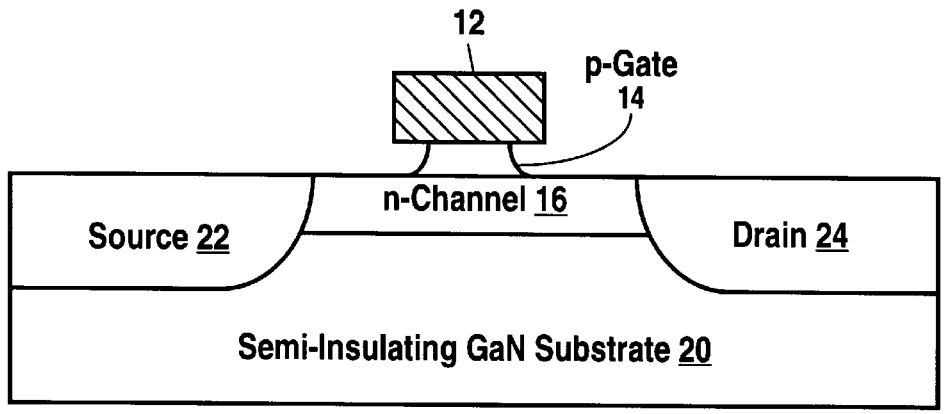
Figure 2F:
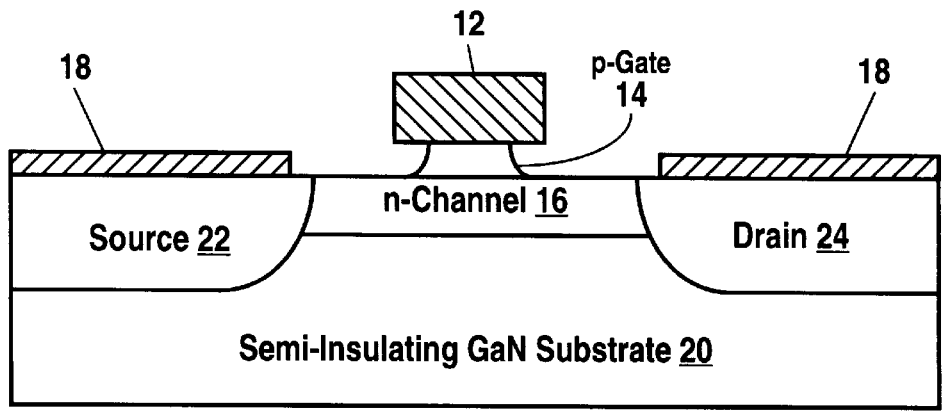

FIGS. 2a–2f show the steps in the fabrication process. FIG. 2a shows selective area ion implantation of the n channel ($^{28}$Si: 100 keV, $2\times10^{14}$ cm$^{-2}$) and p-gate (Ca: 40 keV, $5\times10^{14}$ cm$^{-2}$). FIG. 2b indicates sputter deposition of 300 nanometers of W gate contact metal. FIG. 2c details reactive ion etching (RIE) gate contact patterning using an SF$_6$/Ar plasma; while FIG. 2d shows ion implantation of the source 22 and drain 24 regions ($^{28}$Si: 120 KeV, $7.5\times10^{14}$ cm$^{-2}$ for the source and 170 keV, $1\times10^{15}$ cm$^{-2}$ for the drain, respectively), followed by a 1150° C. 15 second rapid thermal anneal (RTA) to activate the implanted dopants. FIG. 2e shows electron cyclotron resonance (ECR) plasma etching of ~50 nanometers of p-GaN from the source and drain regions using a BCl$_3$/H$_2$/Ar etchant gas mixture, while FIG. 2f indicates deposition of Ti/Al (20 nm/200 nm) ohmic metal and ohmic alloying step (at about 500° C. for about 15 seconds). This device fabrication process minimizes gate capacitances associated with JFETs by self-aligning the p-type gate 14 to the gate contact metal 12. Additionally, since doping is done in selective areas, device isolation is realized by virtue of the semi-insulating properties of the GaN substrate. No implant isolation or mesa etch isolation is required. Several variations of the above-cited process exist. For example, a Mg or Mg+P co-implantation scheme replacing Ca as a p-gate species can be used. P co-implantation can also be used with Ca to form the p-type gate 14. Carbon can also be used for ion implantation of the p-type gate 14. If the device is to be used at high temperature, Zn and Cd can be ion implanted to form the p-type gate 14. The implant anneal temperature can differ depending on the implanted element(s) or particular process recipes.

Further, the sequence of the process can be changed. The source/drain etch depicted in FIG. 2e can be performed prior to the source/drain implant step and before the rapid temperature anneal step shown in FIG. 2d. In this case, some capping of the GaN surface may be required for protection. Also, other gate contact metals (e.g., WSi$_x$, WN, TiWN, and the like) can be used without altering the essence of the invention. The primary requirement for the gate contact is that it withstand the rapid temperature annealing steps without spiking through and shorting the gate p/n junction. Different ohmic contact metallizations can also be employed. Variations in source and drain implant conditions can lead to reductions in JFET resistances. Lastly, a JFET with fully aligned source and drain should have improved performance.

Figure 3A:
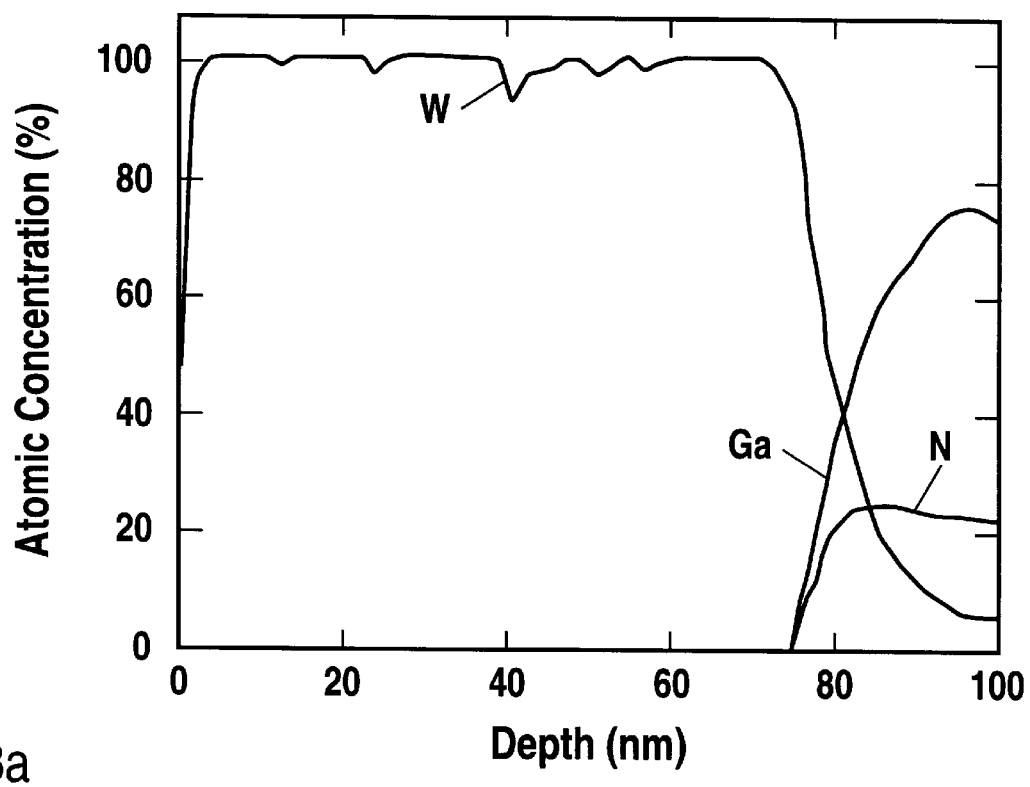
FIGS. 3a–3b show Auger depth profiles for tungsten (W) on GaN before and after an annealing step.
Figure 3B:
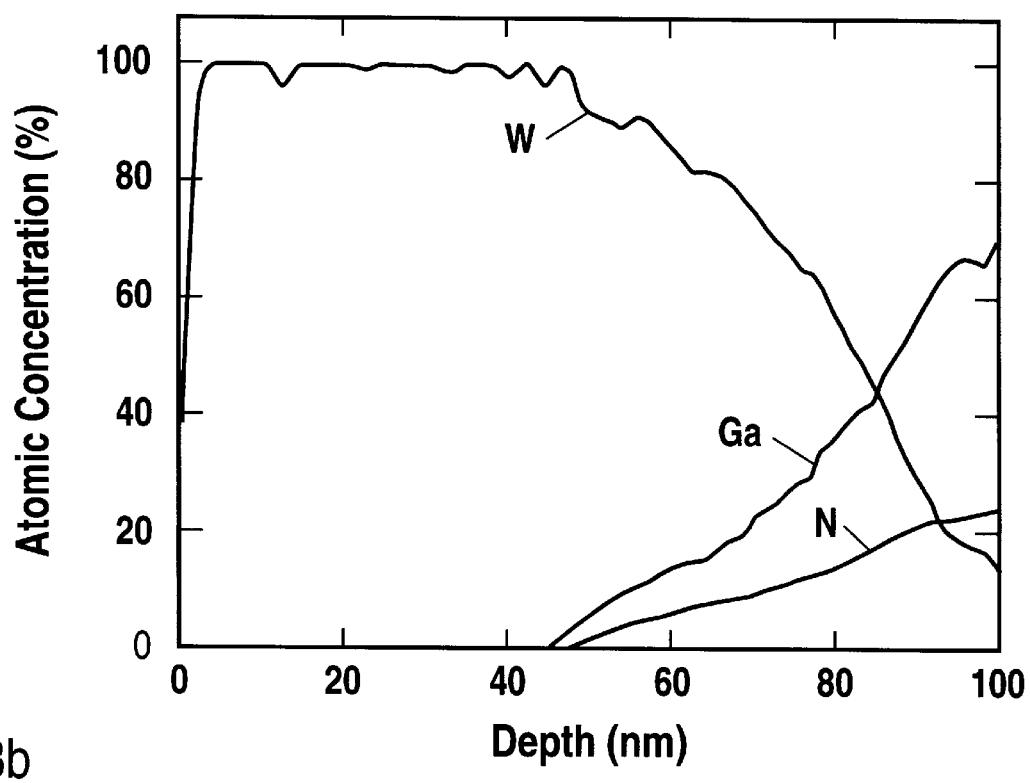

FIG. 3a shows an Auger depth profile for a tungsten (W) gate contact metallization on a GaN substrate 20 as deposited; and FIG. 3b shows an Auger depth profile of the GaN substrate 20 after annealing at 1100° C. for 15 seconds. A comparison of the two Auger depth profiles shows that the annealed tungsten has diffused into the GaN only about 10 nanometers, while Ga and N have diffused about 30 nanometers into the tungsten. Therefore, the Auger data demonstrates that the W/GaN interface is sufficiently stable during the implant activation anneal since the p/n junction depth is expected to be near 45 nanometers, and it is the indiffusion of tungsten that could possibly short the junction. This annealing data also demonstrates the extreme thermal stability of this gate structure for high temperature device operation.

Figure 4:
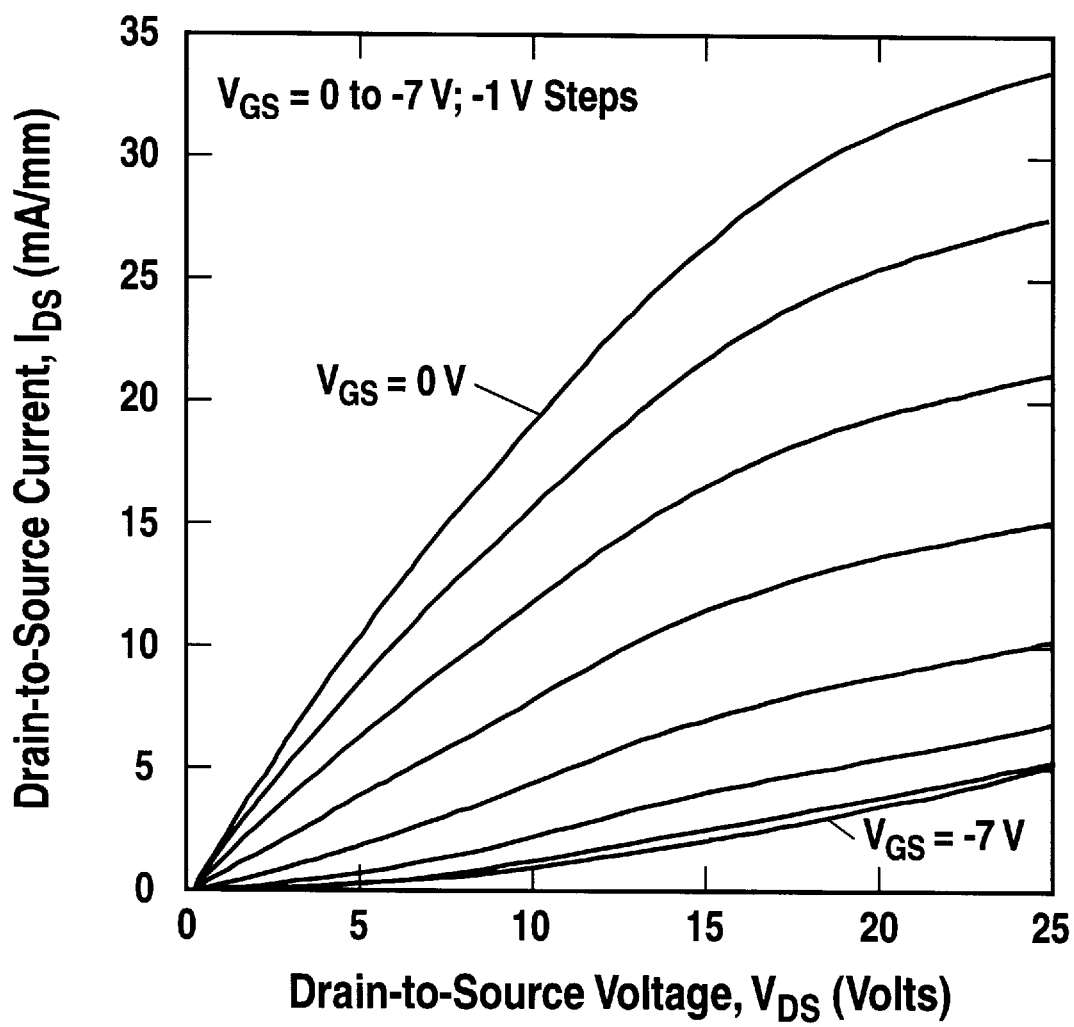
FIG. 4 is a graph showing room temperature drain-to-source current ($I_{DS}$) versus drain-to-source voltage ($V_{DS}$) curves of the GaN JFET.

FIG. 4 shows room temperature curves of drain-to-source current ($I_{DS}$) versus drain-to-source voltage ($V_{DS}$) for different values of gate bias voltage for a GaN JFET 10 having a ~1.7 $\mu$m×50 $\mu$m size gate 14 with a 4 $\mu$m source-to-drain spacing. The JFET 10 shows good modulation characteristics with nearly complete pinch-off at a threshold voltage of approximately −6 V for $V_{DS}$=−7 V. For $V_{DS}$=25 V, a maximum transconductance of 7 mS-mm$^{-1}$ was measured at $V_{GS}$=−2.0 V with a saturation current of 33 mA-mm$^{-1}$ at $V_{GS}$=0 V. The reverse breakdown voltage of the gate junction is estimated to be about −35 V. Four-probe measurements of the source resistance gave $R_s \approx 500$ Ω. Although this value of $R_S$ is large, it only accounts for a 20% reduction in the external transconductance with respect to a corrected internal transconductance of 8.5 mS-mm$^{-1}$. This high resistance is attributed to the region between the ohmic contact and the channel since transmission line method (TLM) test structures using the same source and drain implants on GaN witness pieces gave a value of the specific contact resistance of ~$1\times10^{-5}$ Ω-cm$^2$. This resistance can be substantially reduced by optimizing the source and drain implant conditions and by self-aligning these implants to the gate contact metal. A second possible cause of the low transconductance is a low electron mobility in the implanted n-channel region. If this is the case, optimization of the implant activation process should lead to improved mobilities. This may require higher temperatures or longer annealing times. In addition, optimization of the epitaxial GaN layers for maximum electron mobility, as has been done for epitaxial FETs, should result in improved JFET performance. At room temperature the GaN JFET 10 demonstrated a unity gain cut-off frequency of 2.7 GHz and a maximum oscillation frequency of 9.4 GHz. These frequency metrics are comparable to similar size epitaxial GaN MESFETs.

Figure 5:
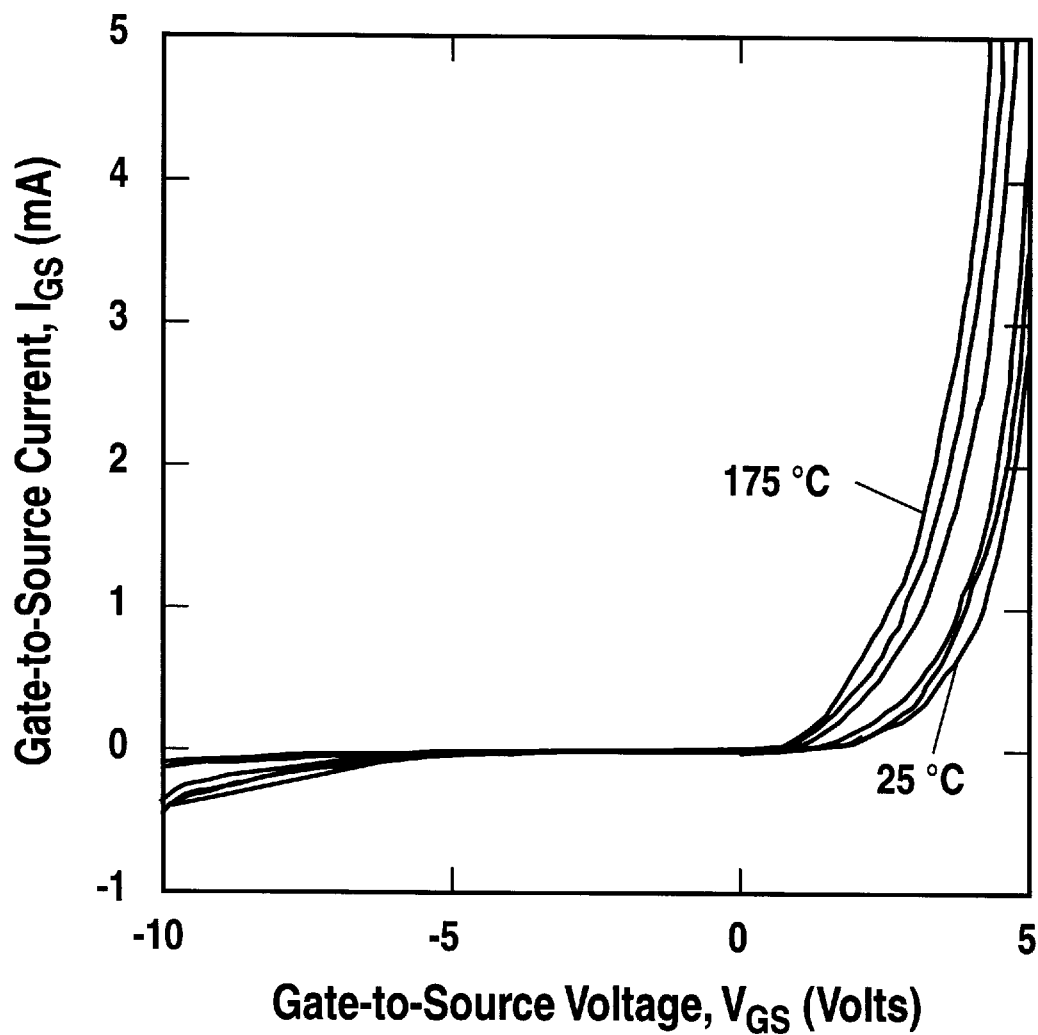
FIG. 5 is a graph showing forward- and reverse-bias gate diode characteristics of the GaN JFET at different temperatures.

FIG. 5 shows forward- and reverse-bias gate diode characteristics of a ~1.7 µm×50 µm GaN JFET 10 at various temperatures. The gate diode provides a room-temperature gate turn-on voltage [$V_{GS}$(on)] of 1.84 V at 1 mA-mm$^{-1}$ of gate current. This gate turn-on voltage is roughly 55% of the bandgap, $E_g$, of GaN (i.e. 0.55 Eg) which is slightly lower than that seen in GaAs JFETs where a gate turn-on voltage of 0.67 Eg or ~0.95 V at 1 mA-mm$^{-1}$ of gate current has been reported. This reduction in $V_{GS}$(on) can be explained if the W-gate contact is not completely ohmic and therefore causes band bending at the surface that will reduce the diode turn-on voltage as a Shannon contact. This effect has been demonstrated in GaAs JFETs. This reduction in $V_{GS}$(on) can be overcome by increasing the p-type doping level of the gate 14, or by employing an improved gate contact scheme.

Figure 6A:
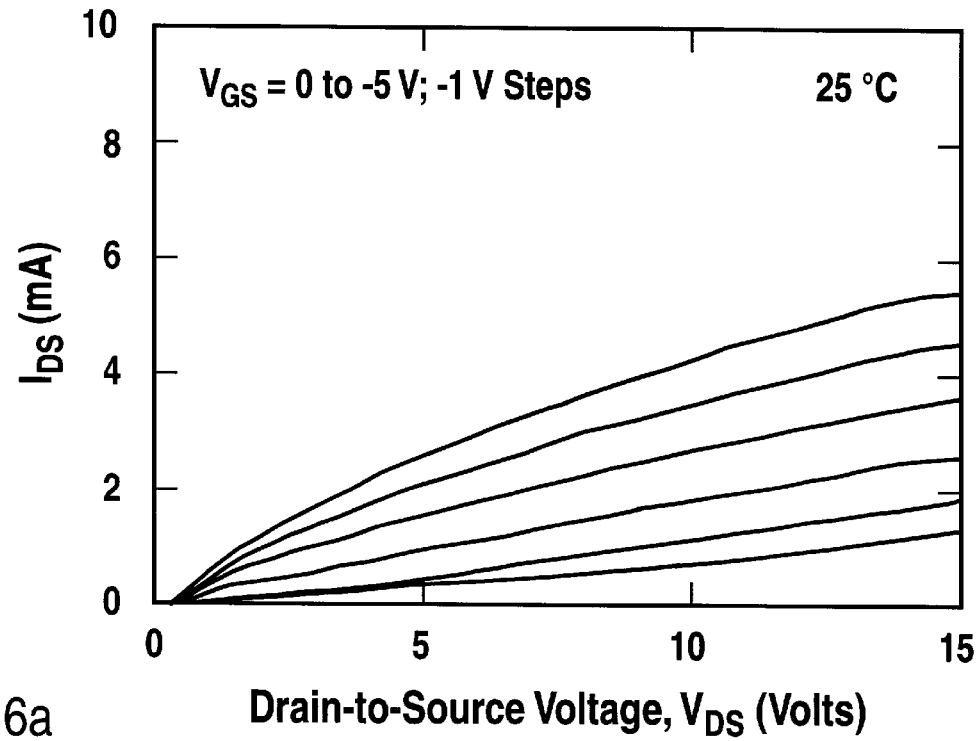
FIGS. 6a–6c are graphs showing drain-to-source current ($I_{DS}$) versus drain-to-source voltage ($V_{DS}$) curves for different values of gate bias voltage at different temperatures.
Figure 6B:
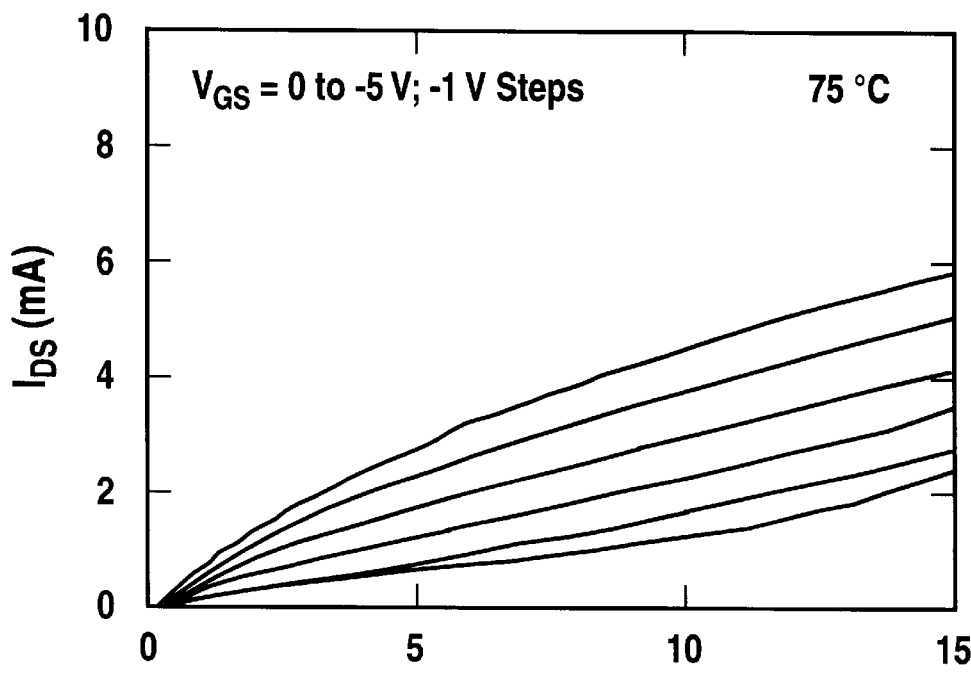
Figure 6C:
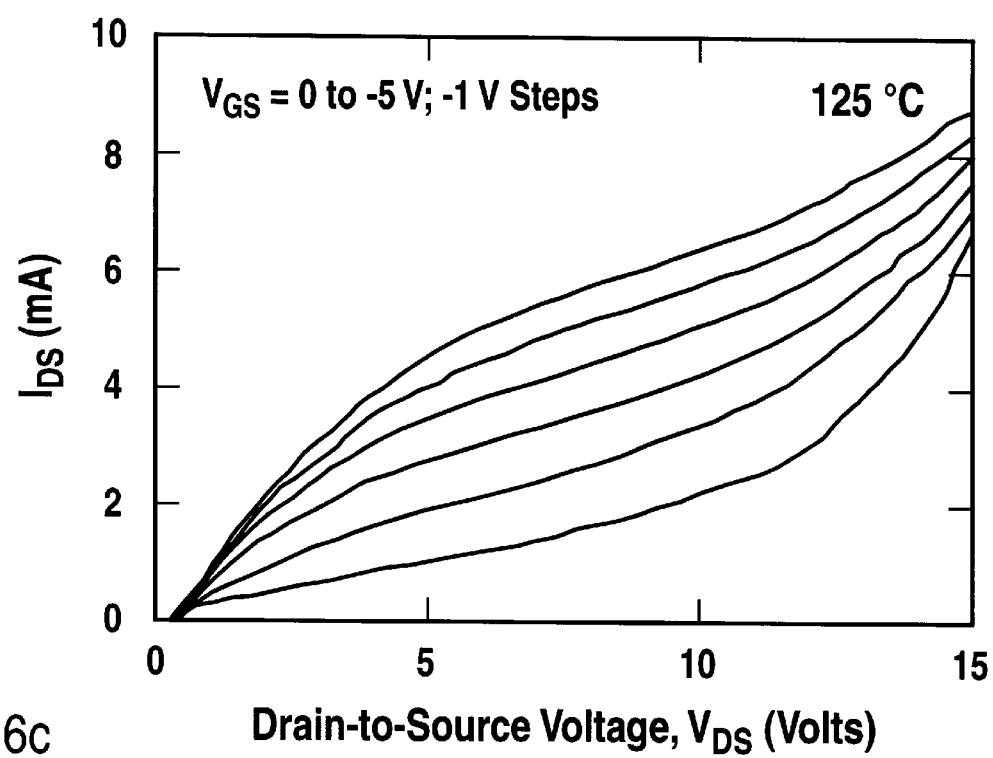

FIGS. 6a–6c show $I_{DS}$ versus $V_{DS}$ curves for varying gate bias at operating temperatures of 25°, 75° and 125° C., respectively. The variation in gate bias was limited to a range of 5 V and the variation in $V_{DS}$ was limited to 15 V to avoid a possibility of gate breakdown at the highest operating temperature. As seen in FIG. 6, the source/ drain pinch-off and breakdown characteristics are degraded with increasing temperature of operation. For $V_{GS}$=−5 V and $V_{DS}$=15 V, the drain-to-source current, $I_{DS}$, increases from 1.3 mA at 25° C., to 2.3 mA at 75° C., and to 6.7 mA at 125° C. where the onset of breakdown is becoming evident. This breakdown may either be due to an increase in substrate conduction, or to defect assisted tunneling conduction of the gate diode for reverse-bias operation. A reverse gate leakage current alone does not explain the behavior of the drain-to-source current in FIG. 6c. From FIG. 5 the gate current at ~10 V and 125° C. is ~0.3 mA while the drain current in FIG. 6c at $V_{GS}$=−5 V and $V_{DS}$=5 V (an effective gate bias of −10 V) is ~1 mA. Further work is needed to understand the mechanism. However, variable temperature Hall measurements on an as-grown GaN substrate 20 shows temperature activated conduction with an estimated activation energy of 335 meV. This may be due to compensating impurities in MOCVD-grown GaN substrates. Therefore, although further study of the gate properties is needed, substrate conduction is expected to be important in the GaN JFET 10 at elevated temperature. However, with the development of improved GaN substrates and channel isolation processes, effects on device operation due to substrate conduction can be minimized.

Figure 7:
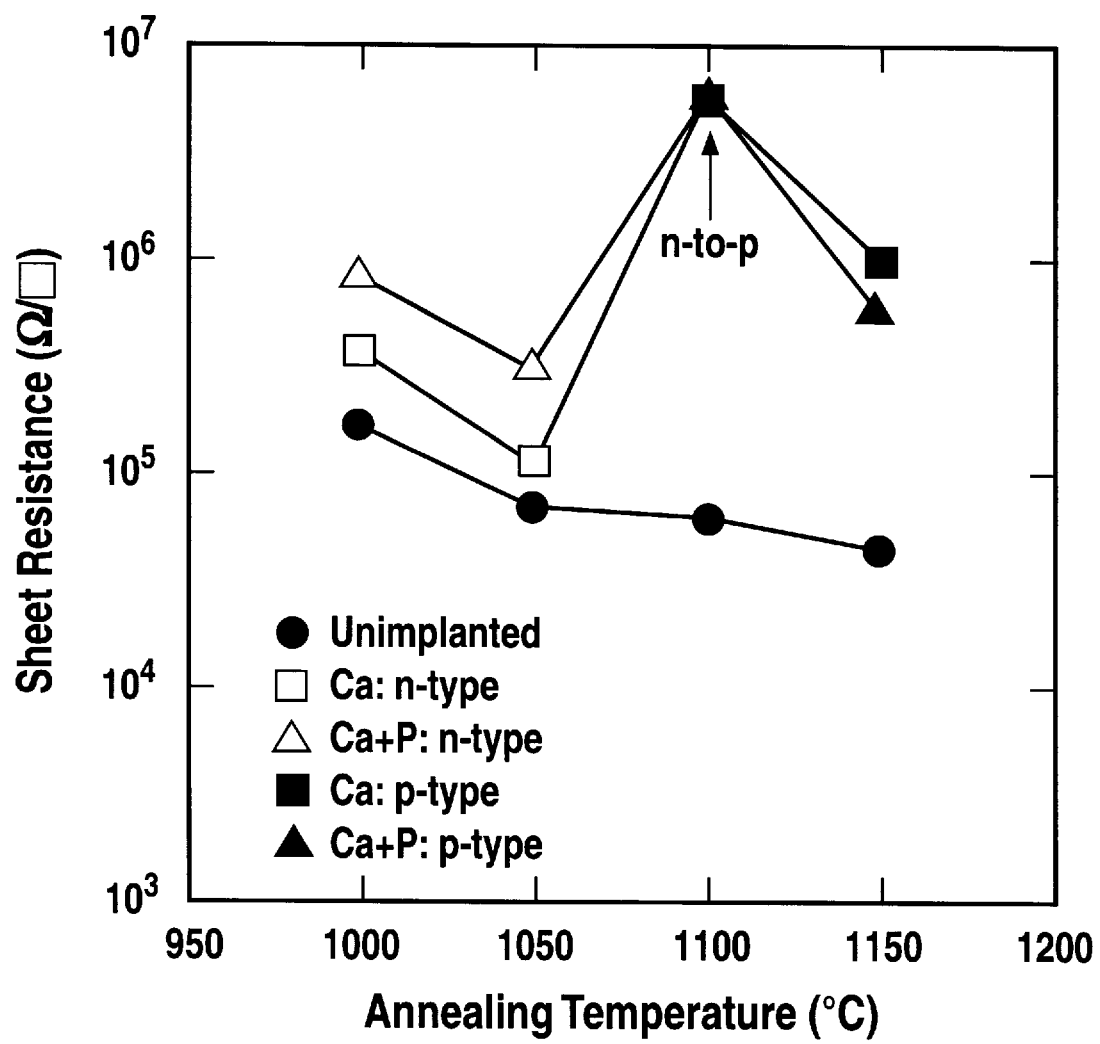
FIG. 7 is a graph of sheet resistance versus annealing temperature for Ca-implanted GaN.

FIG. 7 is a graph of sheet resistance versus annealing temperature for Ca-implanted GaN with and without P co-implantation. Data from an unimplanted and annealed reference sample is included for comparison. Both the Ca-implanted GaN and the Ca+P co-implanted GaN convert from n-type to p-type material after a 1100° C. annealing step. This annealing temperature is slightly higher than the temperature required to achieve p-type conduction in Mg+P co-implanted GaN and may be the result of additional implantation induced damage associated with the heavier Ca-ion. In FIG. 7, the sheet resistance is reduced for annealing at 1150° C., indicating an increased acceptor activity. In the case of the Ca+P co-implanted sample, the sheet resistance is reduced by about 43% as compared to the Ca implanted sample. This is due to a higher sheet hole concentration in the Ca+P co-implanted sample (1.57×10$^{12}$ cm$^{-2}$) compared to that of the Ca implanted sample (1.14× 10$^{12}$ cm$^{-2}$). In FIG. 7, under the same annealing conditions, the unimplanted reference sample remains n-type with a slight decrease in sheet resistance that may result from the creation of additional N-vacancies, or the depassivation of other n-type impurities. The Hall hole mobility of the Ca and Ca+P samples was about 7 cm$^2$V$^{-1}$s$^{-1}$ after an 1150° C. annealing step which is comparable to the Hall mobility for epitaxial Mg-doped GaN.

Figure 8:
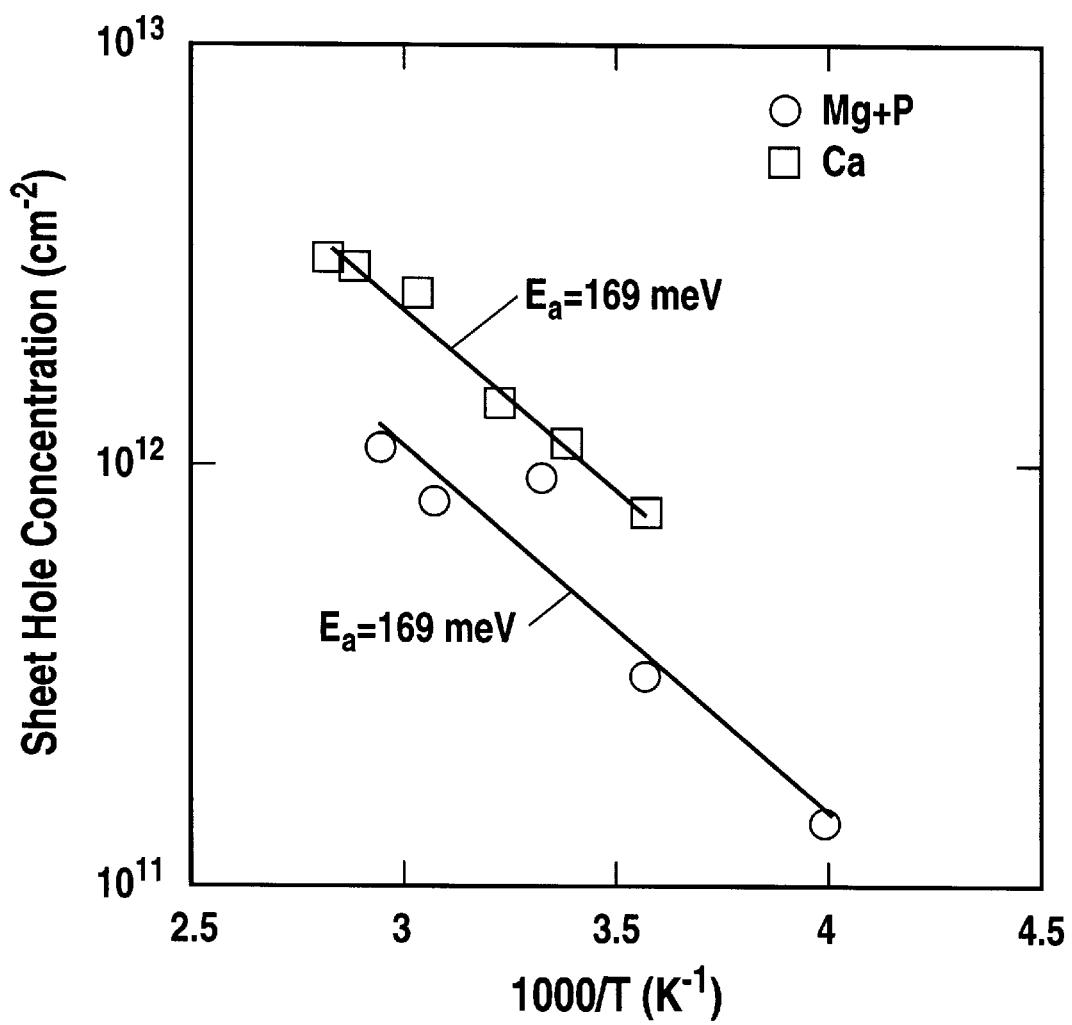
FIG. 8 is an Arrhenius plot for sheet hole concentration for Mg+P and Ca-implanted GaN.

FIG. 8 is an Arrhenius plot of the sheet hole concentration of the 1150° C. annealed Ca-implanted sample along with similar data for a Mg+P implanted sample with the same implant dose, but annealed at 1100° C. A least-squares fit to the data gives an ionization level for Ca of 169 meV and 171 meV for Mg+P in GaN. A higher hole concentration in the Ca-sample may be the result of a more optimum annealing temperature for this sample or a difference in background, compensating impurity concentrations.

Figure 9:
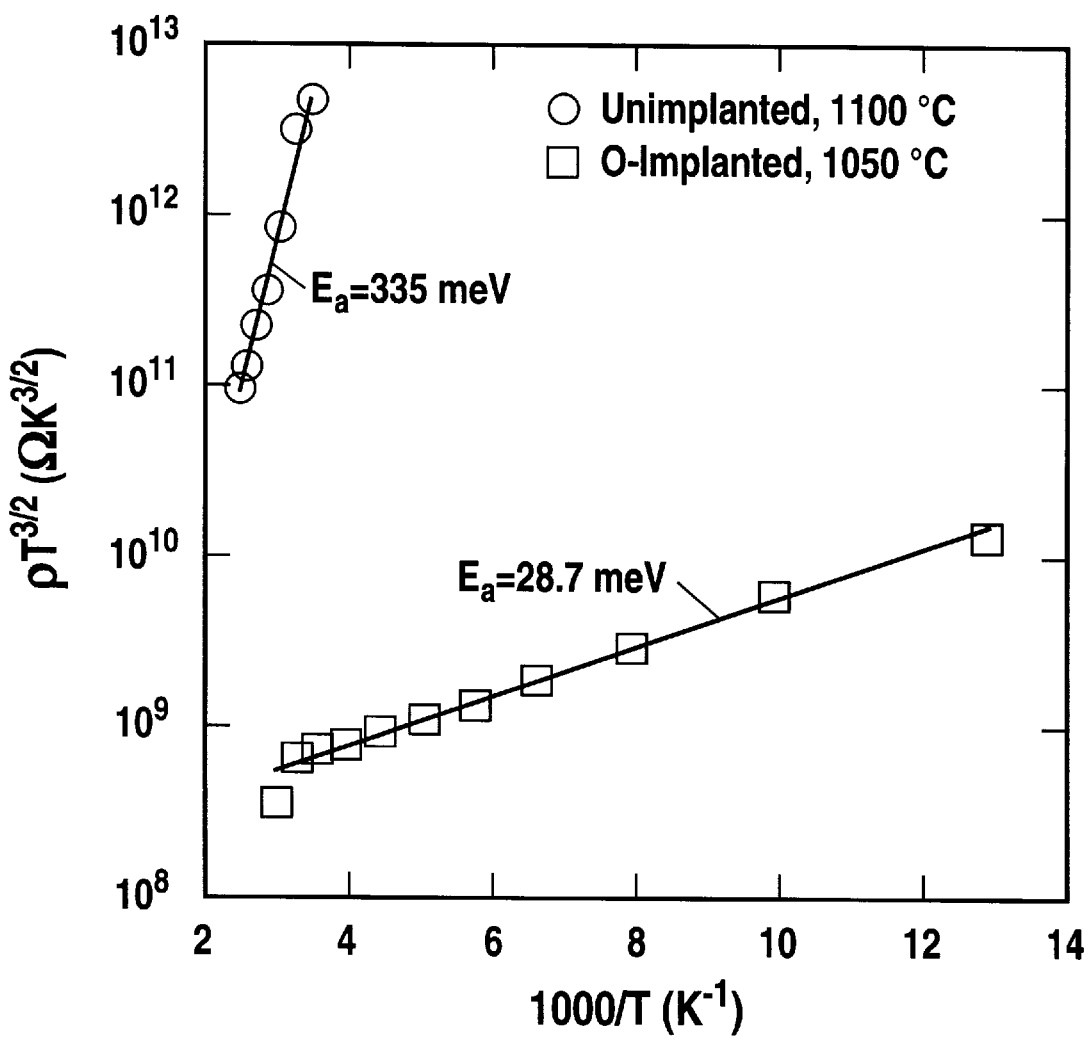
FIG. 9 is an Arrhenius plot of the product of resistance times temperature for unimplanted and O-implanted GaN.

FIG. 9 shows Arrhenius plots of the resistance/ temperature product, $\rho T^{3/2}$, of oxygen-implanted GaN sample annealed at 1050° C. and an unimplanted GaN sample annealed at 1100° C. For n-type conduction, an Arrhenius plot of the resistance/temperature product is believed to be more appropriate to account for the possible presence of a two-band conduction process in GaN. By fitting the data for the O-implanted GaN sample in FIG. 9, an ionization energy, $E_a$, of 28.7 meV is calculated for oxygen. A similar analysis of a Si-implanted GaN sample yielded an ionization energy of 29 meV for silicon.

From these measurements, about one-third of the active donors will be ionized at room temperature, so that only about 3.6% of the implanted oxygen ions ($n_s$=5.9×10$^{12}$ cm$^{-2}$) are expected to be activated at room temperature. This low activation of oxygen may be the result of the lighter oxygen ion not producing sufficient lattice damage due to ion implantation to generate sufficient nitrogen vacancies for the oxygen ions to occupy in substitutional N-sites. The use of co-implantation may help to increase the number of nitrogen vacancies to increase activation of the implanted ions. The low apparent oxygen activation can also be explained by the possible existence of a second deep level for oxygen in GaN that is associated with an oxygen complex. If this is the case, electrons in the second deep level would remain un-ionized at room temperature and therefore would not contribute to a measured electron density. It is to be noted that the unimplanted and annealed GaN sample in FIG. 9 has a calculated activation energy for conduction of 335 eV which is an order of magnitude larger than that of the oxygen ion implanted GaN sample.

Figure 10:
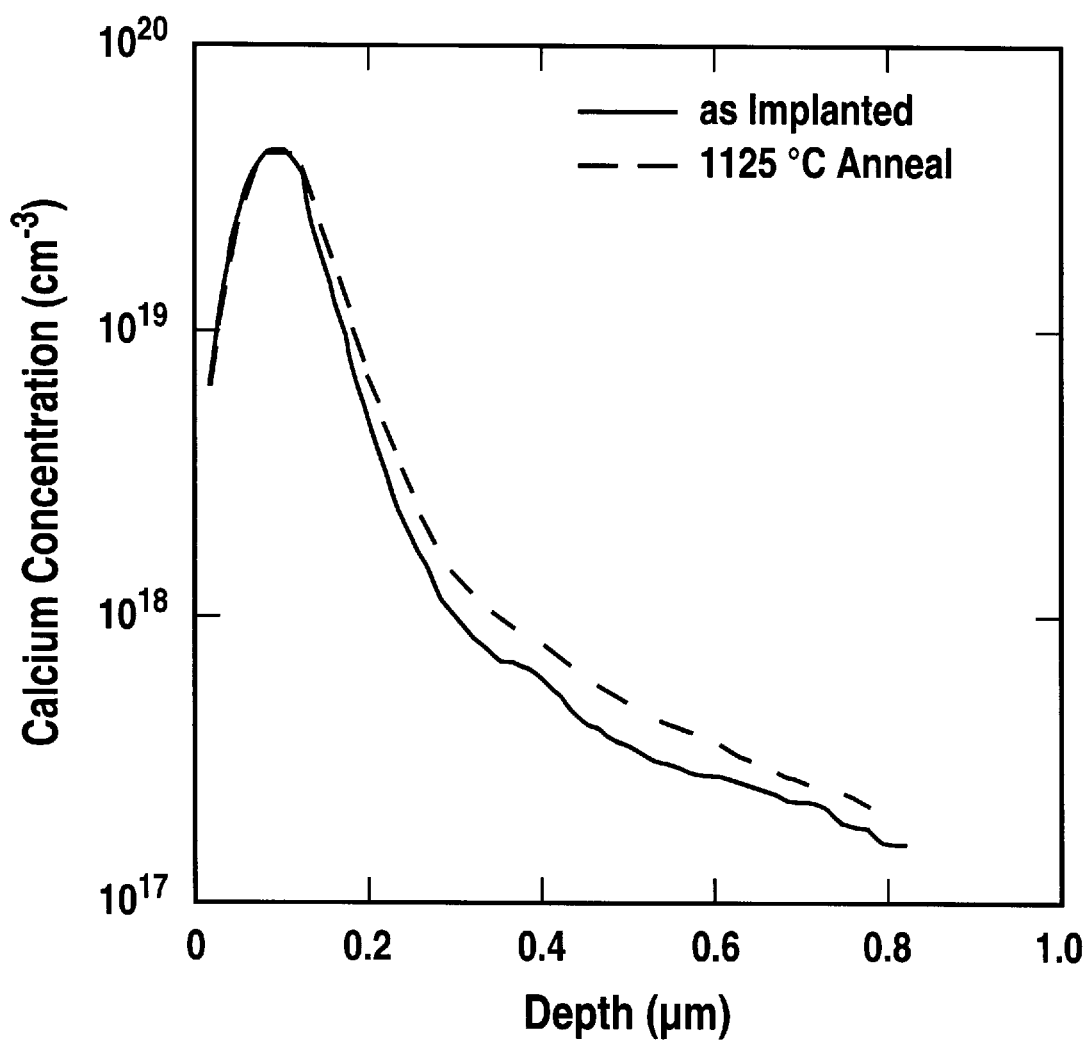
FIG. 10 shows SIMS profiles before and after annealing Ca in GaN.

FIG. 10 shows SIMS profiles for as-implanted and annealed (15 seconds, 1125° C.) Ca in GaN. Within the resolution of the SIMS measurement (~20 nm), no measurable redistribution of calcium occurs even for this high temperature annealing step. By accounting for an ionization energy level of Ca for which only about 0.14% of the Ca-ions are expected to be ionized at room temperature, a peak ionized hole concentration due to ion implanted calcium is estimated to be 6.2×10$^{16}$ cm$^{-3}$ based on a peak calcium concentration of 4.44×10$^{18}$ cm$^{-3}$ from the SIMS measurement in FIG. 10. Although this hole concentration is of the same order as the initial background donor concentration, the actual acceptor concentration is equal to the Ca-concentration in FIG. 10, since, as discussed above, it is estimated that all of the implanted Ca ions will be activated as acceptors based on a 169 meV ionization energy for calcium. Therefore, the unionized Ca-acceptors can compensate the initial background donors and allow a p-type conduction to be achieved.

Figure 11:
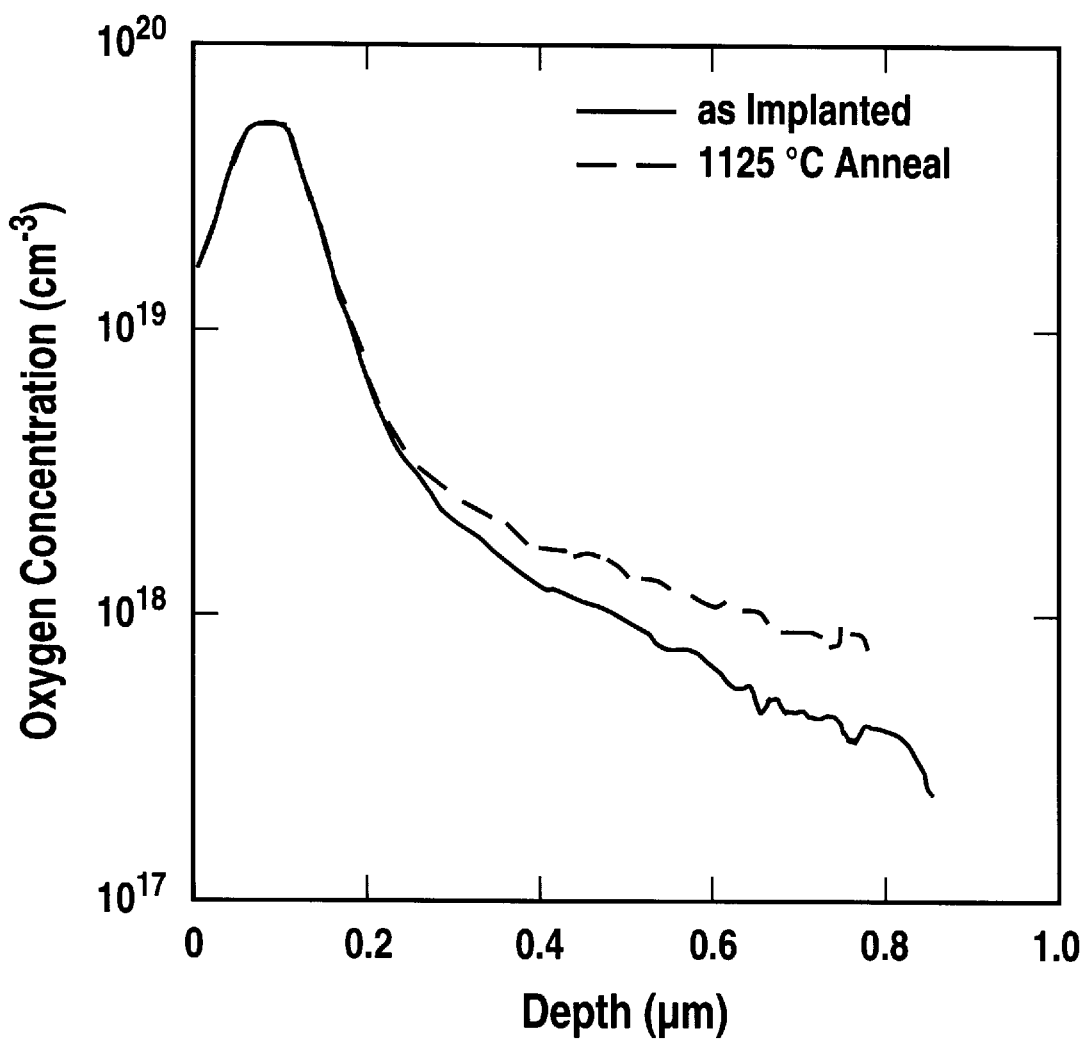
FIG. 11 shows SIMS profiles before and after annealing O in GaN.

FIG. 11 shows SIMS profiles for $^{18}$O ion implanted in GaN, with curves being recorded for an as-implanted GaN sample and a GaN sample annealed at 1125° C. No measurable redistribution of the $^{18}$O is observed near the peak of the curves. This is in contrast to a dramatic redistribution reported for sulfur, another column VI element, that showed a significant redistribution after an annealing step at 600° C. R. G. Wilson, et al., *Appl. Phys. Lett.* vol. 66, p. 2238 (1995). Based on a conservative estimate of the resolution of SIMS measurement of 20 nm, an upper limit of $2.7 \times 10^{-13}$ cm$^2$s$^{-1}$ is estimated for the diffusivity of Ca and O in GaN at an annealing temperature of 1125° C. Ca has an estimated ionization energy of 170 meV which is similar to that of Mg, the only other acceptor with $E_a$<200 meV. Both Ca and O have been shown to display no measurable redistribution for a rapid temperature anneal at 1125° C.

Although the invention has been described in detail with particular reference to these preferred embodiments, other embodiments can achieve the same or similar results. Variations and modifications of the present invention will be obvious to those skilled in the art; and it is intended to cover in the appended claims all such modifications and equivalents. The entire disclosures of all references, applications, patents, and publications cited above are hereby incorporated by reference.

What is claimed is:

1. A gallium-nitride field-effect transistor comprising:
   a) a gallium-nitride substrate;
   b) an n-channel implanted with ions to $10^{17}$–$10^{20}$ cm$^{-3}$ and an ion-implanted p-gate upon said gallium-nitride substrate;
   c) a patterned gate contact of sputter-deposited metal upon said p-gate;
   d) ion-implanted source and drain regions; and
   e) ohmic metal in contact with said source and drain regions.

2. The apparatus of claim 1 wherein said gallium-nitride substrate comprises an epitaxially-grown layer of gallium-nitride upon a c-plane sapphire substrate.

3. The apparatus of claim 1 wherein said n-channel comprises ion-implanted silicon.

4. The apparatus of claim 1 wherein said p-gate comprises ion-implanted calcium.

5. The apparatus of claim 1 wherein said source and drain regions comprise ion-implanted silicon.

6. A gallium-nitride field-effect transistor comrprising:
   a) a gallium-nitride substrate;
   b) an ion-implanted n-channel and a p-gate comprising ion-implanted calcium and phosphorous upon said gallium-nitride substrate;
   c) a patterned gate contact of sputter-deposited metal upon said p-gate;
   d) ion-implanted source and drain regions; and
   e) ohmic metal in contact with said source and drain regions.

7. The apparatus of claim 1 wherein said p-gate comprises ion-implanted magnesium.

8. A gallium-nitride field-effect transistor comprising:
   a) a gallium-nitride substrate;
   b) an ion-implanted n-channel and a p-gate comprising ion-implanted magnesium and phosphorous upon said gallium-nitride substrate;
   c) a patterned gate contact of sputter-deposited metal upon said p-gate;
   d) ion-implanted source and drain regions; and
   e) ohmic metal in contact with said source and drain regions.

9. The apparatus of claim 1 wherein said p-gate comprises ion-implanted ions selected from the group of elements consisting of C, Zn, and Cd.

10. The apparatus of claim 1 wherein said n-channel comprises ion-implanted oxygen.

11. The apparatus of claim 1 wherein said source and drain regions are defined by etching in a plasma containing BCl$_3$, H$_2$, and Ar.

12. The apparatus of claim 1 wherein said patterned gate contact comprises tungsten.

13. The apparatus of claim 1 wherein said patterned gate contact comprises a refractory metal alloy selected from the group consisting of WSi$_2$, WN, and TiWN.

14. The apparatus of claim 1 wherein said ohmic metal comprises approximately 20 nanometers of Ti and approximately 200 nanometers of Al.

15. A gallium-nitride junction field-effect transistor comprising;
   a) a gallium nitride substrate;
   b) an n-channel ion-implanted with silicon or oxygen having an activation energy of about 30 milli-electron-Volts (meV), and an ion-implanted p-gate upon said gallium nitride substrate;
   c) a patterned gate contact of sputter-deposited metal upon said p-gate;
   d) ion-implanted source and drain regions; and
   e) ohmic metal in contact with said source and drain regions.

16. The apparatus of claim 15 wherein said p-gate comprises an ion-implanted dopant selected from the group consisting of calcium; calcium and phosphorous; magnesium; magnesium and phosphorous; carbon; zinc; and cadmium.

17. The apparatus of claim 15 wherein said source and drain regions comprise ion-implanted silicon.

18. A gallium-nitride junction field-effect transistor comprising:
   a) a gallium nitride substrate;
   b) an n-channel ion-implanted with silicon or oxygen at more than $10^{17}$ cm$^{-3}$, and an ion-implanted p-gate upon said gallium nitride substrate;
   c) a patterned gate contact of sputter-deposited metal upon said p-gate;
   d) ion-implanted source and drain regions; and
   e) ohmic metal in contact with said source and drain regions.

19. The apparatus of claim 18 wherein said p-gate comprises an ion-implanted dopant selected from the group consisting of calcium; calcium and phosphorous; magnesium; magnesium and phosphorous; carbon; zinc; and cadmium.

20. The apparatus of claim 18 wherein said source and drain regions comprise ion-implanted silicon.

21. The apparatus of claim 1 wherein said ions in the n-channel have an activation energy of about 30 milli-electron-Volts (meV).

22. The apparatus of claim 1 wherein said ions in the n-channel have an activation energy of less than 150 milli-electron-Volts (meV).

23. The apparatus of claim 6 wherein said gallium-nitride substrate comprises an epitaxially-grown layer of gallium-nitride upon a c-plane sapphire substrate.

24. The apparatus of claim 6 wherein said n-channel comprises ion-implanted silicon or oxygen.

25. The apparatus of claim 6 wherein said source and drain regions comprise ion-implanted silicon.

26. The apparatus of claim 6 wherein said patterned gate contact comprises tungsten.

27. The apparatus of claim 6 wherein said patterned gate contact comprises a refractory metal alloy selected from the group consisting of $WSi_2$, WN, and TiWN.

28. The apparatus of claim 8 wherein said gallium-nitride substrate comprises an epitaxially-grown layer of gallium-nitride upon a c-plane sapphire substrate.

29. The apparatus of claim 8 wherein said n-channel comprises ion-implanted silicon or oxygen.

30. The apparatus of claim 8 wherein said source and drain regions comprise ion-implanted silicon.

31. The apparatus of claim 8 wherein said patterned gate contact comprises tungsten.

32. The apparatus of claim 8 wherein said patterned gate contact comprises a refractory metal alloy selected from the group consisting of $WSi_2$, WN, and TiWN.

33. A gallium-nitride field-effect transistor comprising:
   a) a gallium-nitride substrate;
   b) an n-channel implanted with ions having an activation energy of about 30 milli-electron-Volts (meV) and an ion-implanted p-gate upon said gallium-nitride substrate;
   c) a patterned gate contact of sputter-deposited metal upon said p-gate;
   d) ion-implanted source and drain regions; and
   e) ohmic metal in contact with said source and drain regions.

34. The apparatus of claim 33 wherein said gallium-nitride substrate comprises an epitaxially-grown layer of gallium-nitride upon a c-plane sapphire substrate.

35. The apparatus of claim 33 wherein said n-channel is implanted with ions comprising silicon or oxygen.

36. The apparatus of claim 33 wherein said p-gate is implanted with ions selected from the group consisting of calcium, magnesium, phosphorous, carbon, zinc, cadmium, and combinations thereof.

37. The apparatus of claim 33 wherein said patterned gate contact comprises tungsten.

38. The apparatus of claim 33 wherein said patterned gate contact comprises a refractory metal alloy selected from the group consisting of $WSi_2$, WN, and TiWN.

39. The apparatus of claim 33 wherein said ohmic metal comprises approximately 20 nanometers of Ti and approximately 200 nanometers of Al.

* * * * *